(12) United States Patent
Yang

(10) Patent No.: US 6,653,955 B1
(45) Date of Patent: Nov. 25, 2003

(54) MULTI-SYMBOL VARIABLE LENGTH CODE DECODER

(75) Inventor: Eric Kuo-Uei Yang, Los Altos, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/143,730

(22) Filed: May 9, 2002

(51) Int. Cl.[7] .............................................. H03M 7/40
(52) U.S. Cl. ........................................ 341/67; 341/50
(58) Field of Search ............................ 341/50, 51, 67; 348/426

(56) References Cited

U.S. PATENT DOCUMENTS 5,173,695 A    12/1992  Sun et al. ..................... 341/67
5,502,493 A *  3/1996   Meyer ......................... 348/426
5,561,690 A    10/1996  Park ............................ 375/340
5,650,905 A    7/1997   Bakhmutsky ................. 341/67

* cited by examiner

Primary Examiner—Patrick Wamsley
Assistant Examiner—Joseph Lauture
(74) Attorney, Agent, or Firm—Christopher P. Maiorana, PC

(57) ABSTRACT

An apparatus comprising a first circuit and a logic circuit. The first circuit may be configured to generate a first output signal in response to (i) an input signal, (ii) a first control signal and (iii) a second control signal. The logic circuit may be configured to generate (i) a second output signal, (ii) the first control signal and (iii) the second control signal in response to a predetermined portion of the input signal.

19 Claims, 4 Drawing Sheets

MULTI-SYMBOL VARIABLE LENGTH CODE DECODER

FIELD OF THE INVENTION

The present invention relates to a method and/or architecture for decoding variable length code symbols generally and, more particularly, to a method and/or architecture for a multi-symbol variable length code decoder.

BACKGROUND OF THE INVENTION

In digital data (i.e., audio, video, etc.) transmission systems, data is encoded prior to being transmitted to a receiver. The receiver decodes the encoded digital data. The decoded digital data is then output to a subsequent signal processing stage. To increase the data throughput and memory efficiency of such systems, statistical compression algorithms are used to compress and encode the digital data.

Compressing the data typically results in data streams that are segmented into variable length code words rather than fixed length code words. Variable length decoders are used to decode the variable length code words comprising the compressed data stream. Conventional methods for decoding a sequence of variable length code words include a tree searching algorithm and a table look-up technique.

The tree searching algorithm performs a bit-by-bit search through a code tree to find the end and value of each code word in the input bit stream. Decoding a bit stream using the tree searching algorithm can be too slow for many high speed applications, since the decoding operation is performed at the bit rate rather than at the symbol rate.

To increase the data throughput of a variable length decoder (VLD), the table look-up technique can be used. A conventional table look-up decoder decodes one code word per clock cycle regardless of the code word bit length, thereby increasing the data throughput of the decoder relative to the tree searching algorithm decoder. The actual speed of operation of conventional table look-up decoders can be limited by propagation delay within the decoder.

In addition to technical problems associated with implementing high throughput VLDs, interfacing a high-speed VLD with a large capacity rate buffer can be expensive with currently available memory technology. The problem becomes more severe if price is an issue, since faster and more expensive memory devices such as static random access memories (SRAMs) and synchronous dynamic random access memories (SDRAMs) are used rather than slower and cheaper memory devices such as asynchronous DRAMs. The price of the memory can be a particularly important consideration for a consumer product.

It would be desirable to have a variable length code decoder having a data throughput that is adequate for processing high speed digital data (e.g., video), but at a lower clock rate.

SUMMARY OF THE INVENTION

The present invention concerns an apparatus comprising a first circuit and a logic circuit. The first circuit may be configured to generate a first output signal in response to (i) an input signal, (ii) a first control signal and (iii) a second control signal. The logic circuit may be configured to generate (i) a second output signal, (ii) the first control signal and (iii) the second control signal in response to a predetermined portion of the input signal.

The objects, features and advantages of the present invention include providing a method and/or architecture for a multi-symbol variable length code decoder that may (i) provide high throughput, (ii) decode one or more symbols per clock cycle, (iii) decode short symbols via a hardwired lookup table, (iv) use hardware to determine a first symbol length and/or (v) use a first symbol length to determine a starting point of a second symbol.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
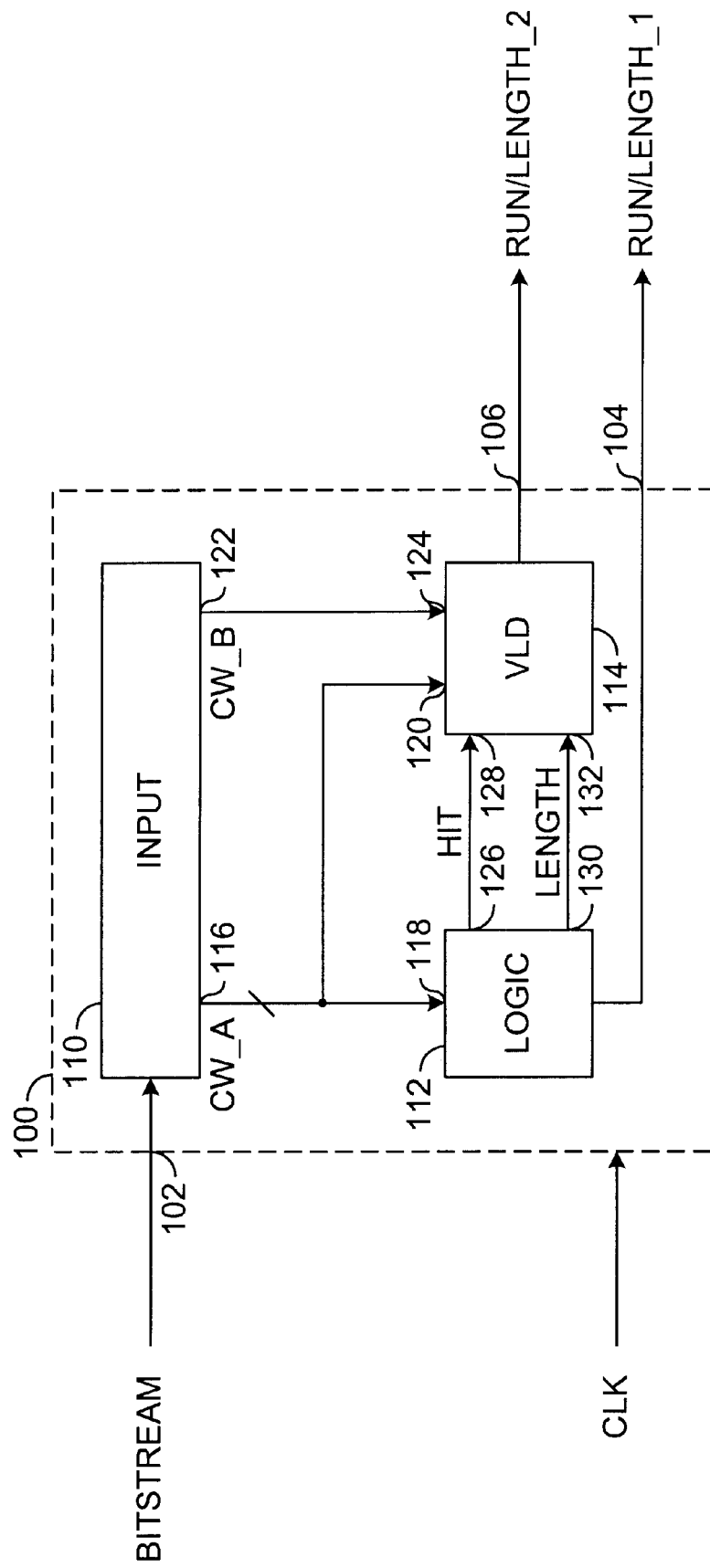
FIG. 1 is a block diagram of a preferred embodiment of the present invention.

Referring to FIG. 1, a block diagram of system 100 is shown in accordance with a preferred embodiment of the present invention. The system 100 may be implemented as a multiple symbol variable length code (VLC) decoder. The system 100 generally decodes at least one symbol per clock cycle from an encoded bit stream. The system 100 may be configured to decode more than one symbol per clock cycle when the encoded bit stream comprises code words with bit lengths less than or equal to a predefined value. In a preferred embodiment, the predefined value may be 7 bits. However, other bit lengths may be implemented accordingly to meet the design criteria of a particular application.

The system 100 may have an input 102 that may receive a signal (e.g., BITSTREAM), an output 104 that may present a signal (e.g., RUN/LENGTH_1) and an output 106 that may present a signal (e.g., RUN/LENGTH_2). The system 100 may be configured to generate the signals RUN/LENGTH_1 and RUN/LENGTH_2 in response to the signal BITSTREAM. The system 100 generally presents at least one of the signals RUN/LENGTH_1 and RUN/LENGTH_2 during each cycle of a clock (e.g., CLK). The signals RUN/LENGTH_1 and RUN/LENGTH_2 may be implemented as output signals. The signals RUN/LENGTH_1 and RUN/LENGTH_2 may comprise, in one example, run lengths, levels, and/or decoded words.

The signal BITSTREAM generally comprises encoded digital data (e.g., audio, video, etc.). The data may be encoded (e.g., compressed) in compliance with any of a number of encoding standards (e.g., MPEG-1, MPEG-2, MPEG-4, JPEG, AC-3, H.26P, etc.). For example, a MPEG bit stream may comprise variable length codes and fixed-length codes. The variable length codes may be shorter in length (e.g., 2–10+bits) than the fixed-length codes. The fixed-length codes may be, for example, 16-bit, 20-bit or 24-bit long. In one example, the signal BITSTREAM may comprise variable length code words encoded with a Huffman coding algorithm.

In Huffman encoded bit streams, code words with higher probability of occurrence are generally encoded with a smaller number of bits than code words with a lower probability of occurrence. For example, the code word(s) with the highest probability of occurrence is(are) generally encoded with the smallest number of bits and the code word(s) with the lowest probability of occurrence is(are) generally encoded with the greatest number of bits. In general, Huffman encoded bit streams comprise code words with a respective bit length that is a function of the probability of occurrence of the respective code word in the bit stream.

The system 100 may comprise a circuit 110, a circuit 112, and a circuit 114. The circuit 110 may be implemented as an input circuit. The circuit 112 may be implemented as a logic circuit. The circuit 114 may be implemented as a variable length decoder (VLD) circuit. The signal BITSTREAM may be presented to an input of the circuit 110. The circuit 110 may have (i) an output 116 that may present a signal (e.g., CW_A) to an input 118 of the circuit 112 and an input 120 of the circuit 114 and (ii) an output 122 that may present a signal (e.g., CW_B) to an input 124 of the circuit 114.

The signals CW_A and CW_B generally comprise contiguous portions of a bit sequence of the signal BITSTREAM. The signal CW_A is generally implemented with a predefined width that is less than a maximum code word bit length of the signal BITSTREAM. In one example, the signal CW_A may be implemented as a 7-bit signal. However, other bit widths may be implemented accordingly to meet the design criteria of a particular application. For example, the signal CW_A may be implemented wider than an average code word bit length of the signal BITSTREAM. The width of the signal CW_A is generally set large enough to provide the circuit 112 with sufficient information to determine whether two targeted (short) decodable code words are present in circuit 142. For example, when the signal CW_A is implemented with a width of 7 bits, the circuit 112 may be configured to determine whether two targeted code words are present where the combined length of the two code words is less than or equal to eleven bits.

The signal CW_B is generally implemented with a width similar to the maximum code word bit length of the signal BITSTREAM. In one example, the signal CW_B may be implemented as a 16-bit signal. However, other widths may be implemented accordingly to meet the design criteria of a particular application.

The circuit 112 may have an output 126 that may present a signal (e.g., HIT) to an input 128 of the circuit 114, an output 130 that may present a signal (e.g., LENGTH) to an input 132 of the circuit 114 and an output that may present the signal RUN/LENGTH_1. The circuit 112 may be configured to generate the signals RUN/LENGTH_1, HIT and LENGTH in response to the signal CW_A. The circuit 112 is generally implemented as a hardwired logic circuit. In one example, the circuit 112 may be implemented as a hardwired look-up table. The circuit 112 may be configured to decode a predetermined number of code words of the signal BITSTREAM that have bit lengths smaller than the width of the signal CW_A. The circuit 112 may be configured to generate the signal RUN/LENGTH_1 as a decoded value of a code word from the signal BITSTREAM.

The signal HIT may be implemented, in one example, as a status signal. For example, a first state of the signal HIT (e.g., a logic HIGH or "1") generally indicates the signal CW_A contains a code word that the circuit 112 is configured to decode. A second state of the signal HIT (e.g., a logic LOW or "0") generally indicates that one of the code words that the circuit 112 is configured to decode was not detected in the signal CW_A. When a code word that is decodable by the circuit 112 is detected in the signal CW_A, the circuit 112 generally presents the bit length of the detected code word via the signal LENGTH and the run length, level, and/or decoded value of the code word via the signal RUN/LENGTH_1. The signals HIT and LENGTH may be used as control signals.

The circuit 114 may be configured to generate the signal RUN/LENGTH_2 in response to one or more of the signals CW_A, CW_B, HIT, and LENGTH. For example, when the signal HIT indicates that the circuit 112 did not decode a code word, the circuit 114 generally examines the combined signals CW_A and CW_B to detect and decode a symbol. When the signal HIT indicates that the circuit 112 is decoding a first symbol, the circuit 114 is generally configured to decode a second symbol in response to the signal CW_B combined with a number of bits of the signal CW_A exclusive of the number of bits specified by the signal LENGTH. The circuits 112 and 114 are generally configured to detect and decode at least one, and generally two, symbols within a single clock cycle. When the signal CW_A contains a symbol (e.g., a code word for the symbol is smaller than the predetermined width of the signal CW_A), the system 100 generally decodes two symbols in one clock cycle.

Figure 2:
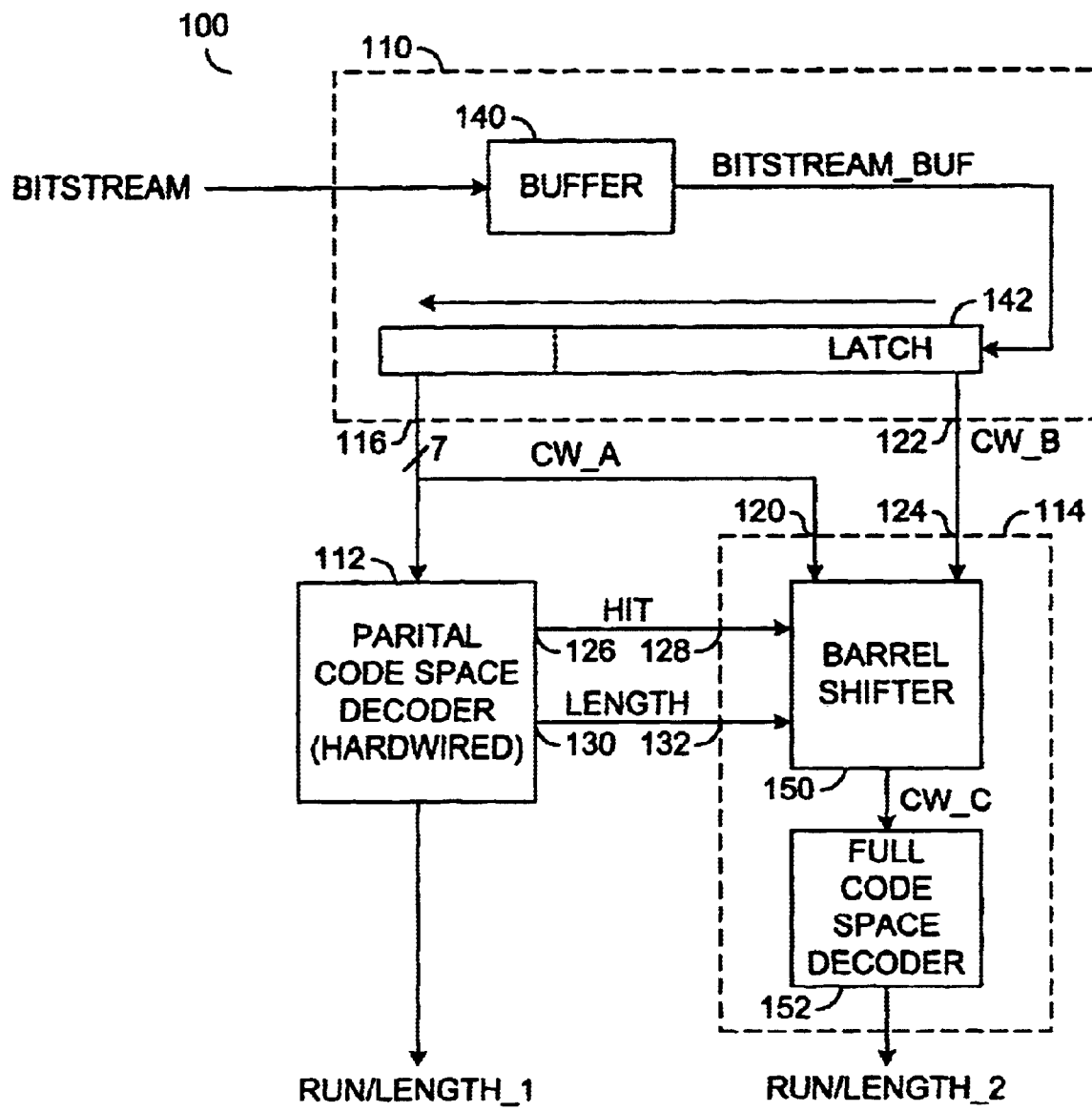
FIG. 2 is a more detailed block diagram of a preferred embodiment of the present invention.

Referring to FIG. 2, a more detailed block diagram of a preferred embodiment of the present invention is shown. The circuit 110 may comprise, in one example, a circuit 140 and a circuit 142. The circuit 140 may be implemented, in one example, as a buffer. In one example, the circuit 140 may be implemented as a FIFO memory. The circuit 142 may be implemented, in one example, as a latch or register. In an alternative embodiment, the circuit 142 may comprise a barrel shifter configured to generate the signals CW_A and CW_B as portions of a sliding decoding window. The signal BITSTREAM may be presented to an input of a circuit 140. The circuit 140 may have an output that may present a signal (e.g., BITSTREAM_BUF) to an input of the circuit 142. The circuit 142 may have an output that may present the signal CW_A and an output that may present the signal CW_B.

The circuit 112 may be implemented, in one example, as a partial code space decoder. The circuit 112 may be a hardwired logic circuit configured to decode a number of targeted (short) code words that may comprise a subset of the full decodable code space of the signal BITSTREAM. The circuit 114 may comprise, in one example, a circuit 150 and a circuit 152. The circuit 150 may be implemented, in one example, as a barrel shifter. The circuit 152 may be implemented, in one example, as a full code space decoder. For example, the circuit 152 may comprise a memory based variable length code decoder and a memory based fixed-length code decoder (described in more detail in connection with FIG. 3). In one example, the circuit 152 may comprise one or more look-up tables stored in memory. In one example, the memory may be implemented as a read only memory (ROM). However, other types of memory (e.g., RAM, EPROM, EEPROM, etc.) may be implemented to meet the design criteria of a particular application.

The signals CW_A, CW_B, HIT and LENGTH may be presented to inputs of the circuit 150. The circuit 150 may have an output that may present a signal (e.g., CW_C) to an input of the circuit 152. The circuit 152 may have an output that may present the signal RUN/LENGTH_2.

The circuit 112 is generally configured to decode a first symbol based on a presumption that the signal BIT- STREAM contains targeted code words with bit lengths less than or equal to the predetermined width of the signal CW_A (e.g., 7 bits). When the circuit 112 is decoding a first symbol, the circuit 112 generally (i) asserts the signal HIT, (ii) generates the signal LENGTH comprising the bit length of the code word encoding the first symbol and (iii) presents the decoded symbol. When the signal HIT is in the asserted state, the circuit 114 is generally configured to decode a second symbol from the remaining bits of the signals CW_A and CW_B. The circuit 152 generally comprises an entire code table for the particular encoding scheme. However, the circuit 152 may comprise more than one code table to meet the design criteria of a particular application. The circuit 114 is generally configured to remove the bits already being decoded by the circuit 112 in response to the signals LENGTH and HIT. The circuit 100 generally decodes the first and second symbols in parallel.

When the circuit 112 does not detect a code word for a first symbol within the signal CW_A, the signal HIT is presented in an unasserted state (e.g., a logic low or "0"). When the signal HIT is unasserted, the barrel shifter 150 is generally configured to include the entire width of the signal CW_A in the decoding window. Since the combined width of the signal CW_A and CW_B is generally wider than the maximum code word bit length of the signal BITSTREAM, the circuit 100 generally decodes at least one code word for each clock cycle. As the width of the signal CW_A is increased, the number of targeted (qualified) code words increases. The width of the signal CW_A may be configured to allow decoding of most (or all) of the code words in the signal BITSTREAM at a rate of two code words per-cycle. The width of the signal CW_A may be determined based on a balancing of cost and performance of the circuit 100.

When the circuit 100 has decoded the symbol or symbols contained in the signals CW_A and CW_B, the bits that encoded the symbol(s) are generally shifted out of the circuit 142 and undecoded bits shifted in from the circuit 140. The decoding process is generally repeated, until the entire bit stream has been decoded.

Figure 3:
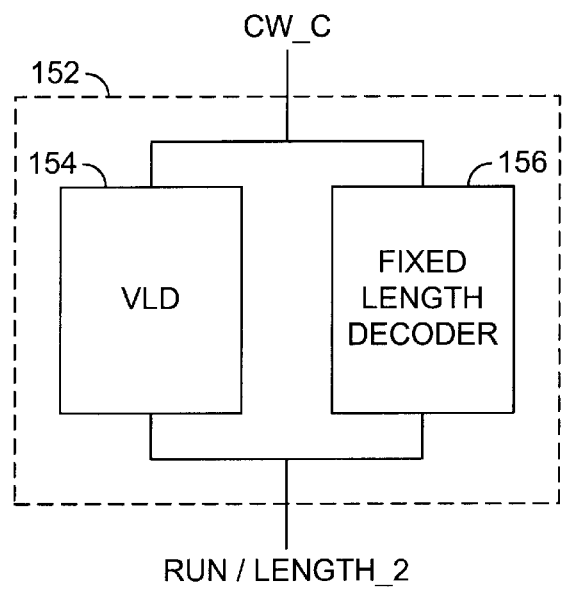
FIG. 3 is a more detailed block diagram of a full code space decoder of FIG. 2.

Referring to FIG. 3, a more detailed block diagram of a full code space decoder of FIG. 2 is shown. The circuit 152 may comprise, in one example, a variable length decoder 154 and a fixed length decoder 156. The circuits 154 and 156 may be look-up table (or memory) based decoders. The signal CW_C may be presented to an input of the circuit 154 and an input of the circuit 156. The signal RUN/LENGTH_2 may be presented at a combined output of the circuits 154 and 156. In general, the circuit 154 and the circuit 156 run in parallel to decode variable length codes and fixed length codes that may be contained in the signal BITSTREAM. In one example, the circuit 156 may be implemented as a ROM based fixed length decoder.

Figure 4:
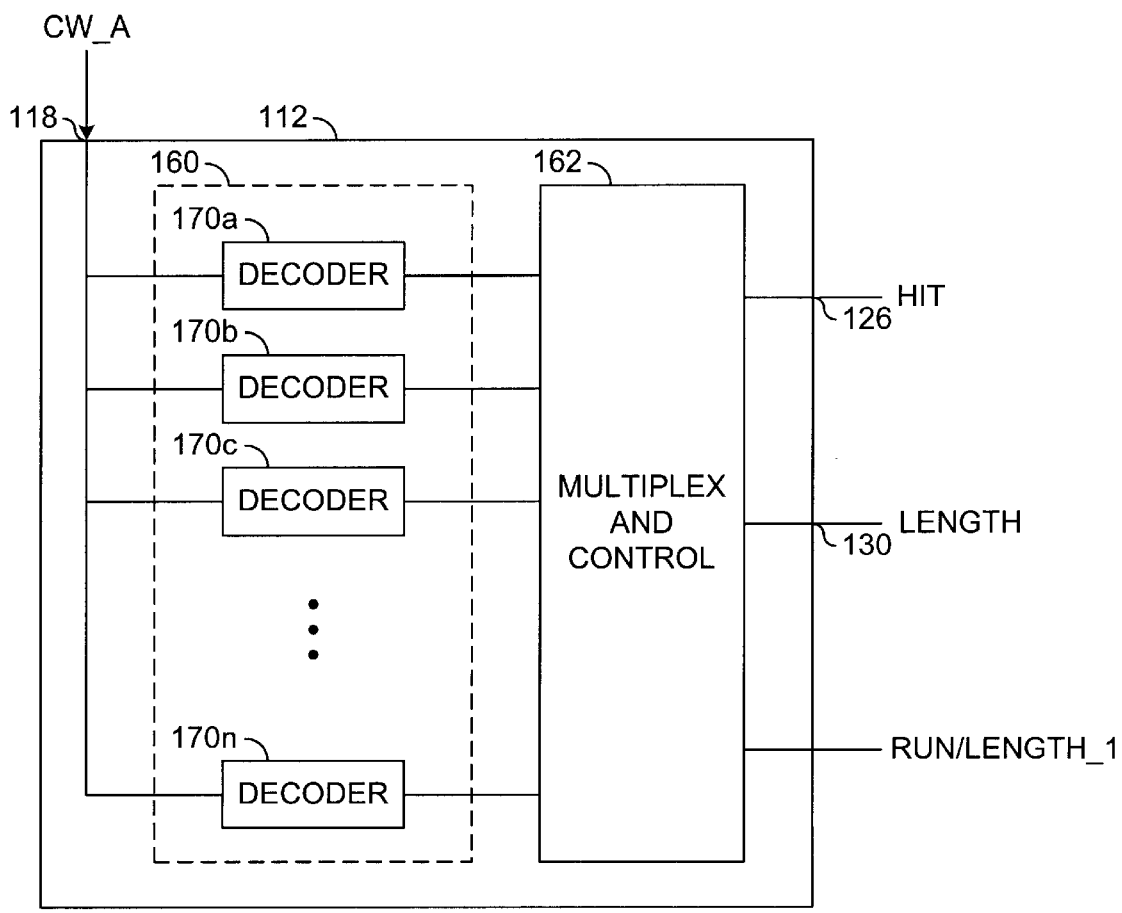
FIG. 4 is a more detailed block diagram of a logic circuit of FIG. 1.

Referring to FIG. 4, a more detailed block diagram of a circuit 112 in accordance with a preferred embodiment of the present invention is shown. The circuit 112 may comprise a circuit 160 and a circuit 162. The circuit 160 may be implemented, in one example, as a hardwired decoder circuit. The circuit 162 may be implemented, in one example, as a multiplexer and control circuit. The circuit 160 may be configured to generate a number of predetermined signals (e.g., run lengths, levels, lengths, fixed-length code words, etc.) in response to the signal CW_A containing a corresponding predetermined bit pattern. For example, the circuit 160 may be configured to generate a run length, a level, a length, and/or a fixed-length code word for each of a number of bit patterns that may be contained within the signal CW_A. In one example, the circuit 160 may be configured to generate a number of coefficients (e.g., from MPEG-2 Table B-14) as described in the following TABLE 1:

TABLE 1

| Code from CW_A | Run | Level | Length |
|---|---|---|---|
| 1s* | 0 | 1 | 2 |
| 11s | 0 | 1 | 3 |
| 011s | 1 | 1 | 4 |
| 0100s | 0 | 2 | 5 |
| 0101s | 2 | 1 | 5 |
| 00101s | 0 | 3 | 6 |
| 0000 110s | 0 | 4 | 8 |
| 0010 0110s | 0 | 5 | 9 |
| 0010 0001s | 0 | 6 | 9 |
| 0000 0010 10s | 0 | 7 | 11 |

Where s represents a sign bit (e.g., "1"or "0") that generally indicates whether the code is a positive or negative number. The code "1s" is generally a valid AC code only as the first code of a non-intra block. Otherwise, the code "10"is generally an end-of-block (EOB) and the code "11"is not a complete code.

When the leading bit of the signal CW_A is "0"(e.g., "011s" as shown on line 4 of Table 1), the signal CW_A generally will not have two decodable codes that have a combined width of 4. When the first code word of the signal CW_A has a width over the targeted decodable code length (e.g., 7-bits), the circuit 112 generally stops in the attempt to decode the signal during the respective cycle and generates the signal HIT in an unasserted state. In response to the signal HIT having the unasserted state, the circuit 114 generally decodes the code word. For example, when the circuit 112 is configured to receive a 7-bit signal, the code words in the last four rows in Table 1are generally decoded by the circuit 114 instead of the circuit 112. In general, the targeted decodable code length is determined by a trade off between the performance and the cost of a particular design.

In another example, the circuit 160 may be configured to decode a number of predetermined bit patterns that may be contained within the signal CW_A according to MPEG Table B-15 as shown in the following TABLE 2:

TABLE 2

| Code | Run | Level | Length |
|---|---|---|---|
| 10s | 0 | 1 | 3 |
| 010s | 1 | 1 | 4 |
| 110s | 0 | 2 | 4 |
| 0111s | 0 | 3 | 5 |
| 1110 0s | 0 | 4 | 6 |
| 1110 1s | 0 | 5 | 6 |
| 0001 01s | 0 | 6 | 7 |
| 0001 00s | 0 | 7 | 7 |
| 1111 011s | 0 | 8 | 8 |
| 1111 100s | 0 | 9 | 8 |
| 0010 0011s | 0 | 10 | 9 |
| 0010 0010s | 0 | 11 | 9 |
| 1111 1010s | 0 | 12 | 9 |
| 1111 1011s | 0 | 13 | 9 |
| 1111 1110s | 0 | 14 | 9 |
| 1111 1111s | 0 | 15 | 9 |

However, other bit patterns and associated symbols may be implemented accordingly to meet the design criteria of a particular application. For example, decoding tables in compliance with one or more encoding specifications (e.g., MPEG-1, MPEG-2, MPEG-4, MBA, CBP, MCode, H26P, etc.) may be implemented.

The circuit 162 may be configured to generate the signals HIT, LENGTH, and RUN/LENGTH_1 in response to the signals generated by the circuit 160. For example, when the circuit 160 generates an output in response to one of the predetermined bit patterns, the circuit 162 may be configured to assert the signal HIT, present the length of the predetermined bit pattern via the signal LENGTH, and present the associated symbol via the signal RUN/LENGTH_1. When the circuit 160 does not generate an output (e.g., the signal CW_A does not contain any of the predetermined bit patterns), the circuit 162 may be configured to generate the signal HIT in the un-asserted state.

In one example, the circuit 160 may comprise a number of decoder circuits 170a–170n. The decoder circuits 170a–170n may be configured, for example, (i) to decode a first AC coefficient symbol; (ii) to decode length codes and/or fixed length code words for codes listed in Table B-14 of the MPEG-2 specification; (iii) to decode length codes and/or fixed length code words according to Table B-14 of the MPEG-2 specification for compressed codes shifted by a number of bits (e.g., 2, 3, 4, 5, 6, 8, 9, or 11 bits); (iv) to decode length codes and/or fixed length code words for codes listed in Table B-15 of the MPEG-2 specification; (v) to decode length codes and/or fixed length code words according to Table B-15 of the MPEG-2 specification for compressed codes shifted by a number of bits (e.g., 2, 3, 4, 5, 6, 8, 9, or 11 bits); (vi) to decode length codes and/or fixed-length code words according to one or more of the tables B-1, B-2, B-3, B-4, B-9, B-10 of the MPEG-2 specification; (vii) to decode run, level, and/or other information; and/or (viii) to decode length codes and/or fixed length code words for any other compressed data standard accordingly to meet the design criteria of a particular application.

Figure 5:
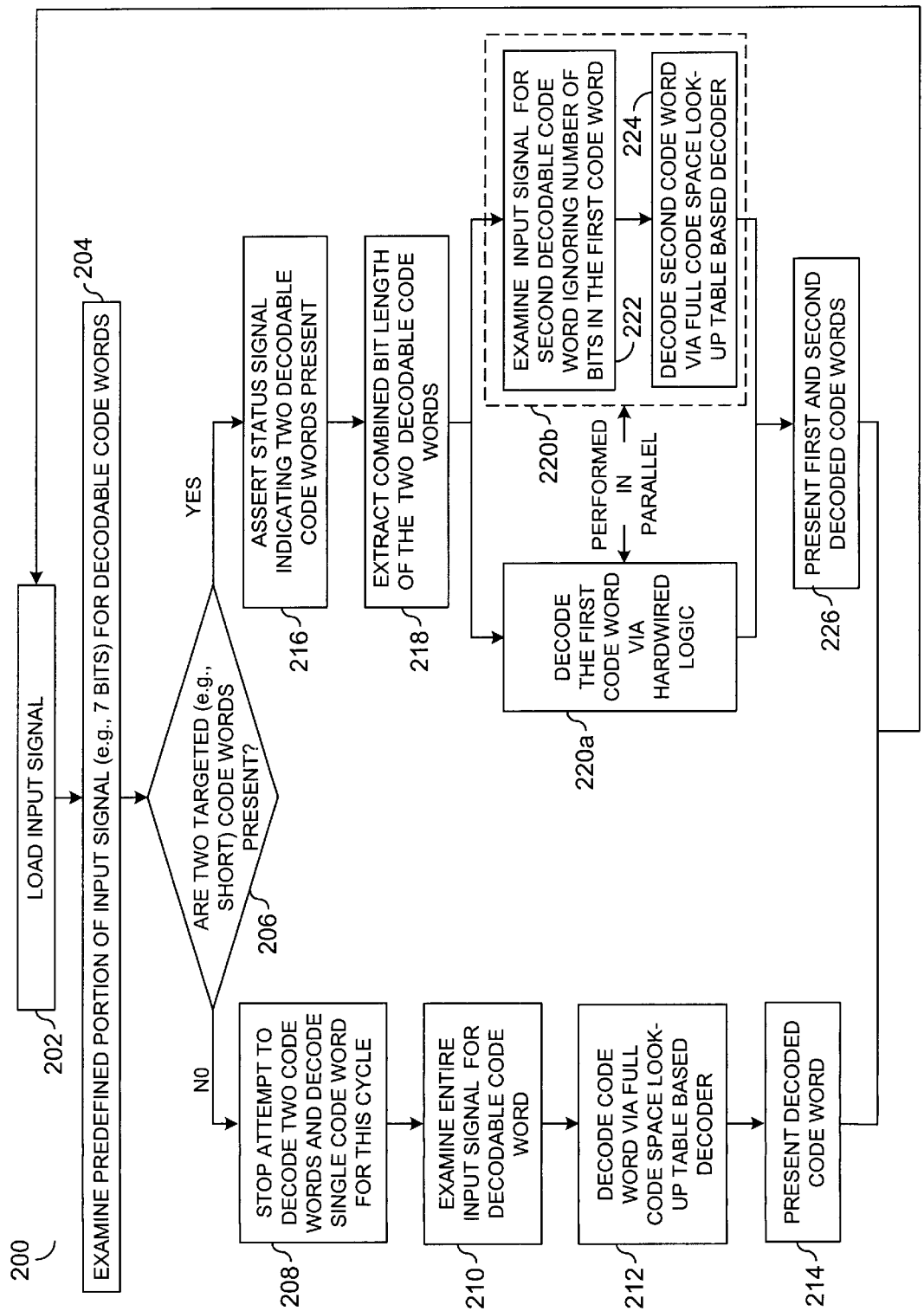
FIG. 5 is a flow diagram of an example operation in accordance with a preferred embodiment of the present invention.

Referring to FIG. 5, a flow diagram 200 illustrating an example operation in accordance with a preferred embodiment of the present invention is shown. An input signal is generally loaded for an encoded bit stream (e.g., the block 202). A predefined portion of the input signal (e.g., 7-bits) is generally examined to detect the presence of two targeted code word bit patterns (e.g., the block 204 and 206). When the predetermined portion of the input signal does not indicate that two targeted code words are present in the input signal, the attempt to decode two code words may be stopped and only one code word decoded in the cycle (e.g., the block 208). The entire input signal is examined to determine whether a decodable code word is present (e.g., the block 210). A decodable code present in the input signal is generally decoded via a full code space look-up table based decoder (e.g., the block 212). The full code space decoder may comprise, in one example, a variable length decoder and a fixed length decoder running in parallel. The decoded code word (symbol) is generally presented to a subsequent circuit (e.g., the block 214).

When two decodable code words are detected within the input signal, (i) a status signal is generally asserted (e.g., the block 216) and (ii) a combined bit length of the two decodable words is determined (e.g., the block 218). The two code words are generally decoded in parallel. For example, the first code word is generally decoded via hardwired logic (e.g., the block 220a) while the second code word is decoded via the memory based decoder (e.g., the block 220b). The memory based decoder generally examines the input signal less the number of bits in the first code word (e.g., the block 222) and decodes the second code word via entries in the full code space look-up table based decoder (e.g., the block 224). When the first code word has been decoded via the hardwired logic and the second code word has been decoded via the memory based decoder, the first and second decoded code words are generally presented to a subsequent circuit (e.g., the block 226). The process 200 is generally repeated for subsequent undecoded bit sequences of the encoded bit stream.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit comprising a barrel shifter and a memory based decoder, configured to generate a first output signal in response to (i) an input signal, (ii) a first control signal and (iii) a second control signal; and
   a logic circuit configured to generate (i) a second output signal, (ii) said first control signal and (iii) said second control signal in response to a predetermined portion of said input signal.

2. The apparatus according to claim 1, wherein said apparatus comprises a multi-symbol variable length code decoder.

3. The apparatus according to claim 1, wherein said logic circuit comprises one or more hardwired look-up tables configured to generate (i) said second output signal, (ii) said first control signal and (iii) said second control signal in response to said predetermined portion of said input signal.

4. The apparatus according to claim 3, wherein said one or more hardwired look-up tables are configured to decode a plurality of variable length code words having a bit length shorter than said predetermined portion of said input signal.

5. The apparatus according to claim 1, further comprising an input circuit configured to generate said input signal in response to an encoded bit stream.

6. The apparatus according to claim 5, wherein a width of said predetermined portion of said input signal is wider than an average code word bit length of said encoded bit stream.

7. The apparatus according to claim 1, wherein said barrel shifter is configured to shift a sliding decoding window in response to said first and said second control signals.

8. The apparatus according to claim 7, wherein said memory based decoder is configured to generate said first output signal in response to a portion of said input signal presented by said sliding decoding window.

9. The apparatus according to claim 1, wherein said memory based decoder is configured to decode one or more code of one or more data compression standards.

10. A method for decoding multiple symbols of a variable length code in a single clock cycle comprising the steps of:
   (A) generating a first output signal, a first control signal and a second control signal in response to a predetermined portion of an input signal;
   (B) generating a second output signal in response to said input signal, said first control signal and said second control signal; and
   (C) decoding a second portion of said input signal in response to said first and said second control signals.

11. The method according to claim 10, wherein (i) said first output signal, (ii) said first control signal and (iii) said second control signal are generated via one or more hardwired look-up tables.

12. The method according to claim 10, further comprising the step of:
   examining said predetermined portion of said input signal to detect one or more variable length code words.

13. The method according to claim 10, further comprising the step of:
  generating said input signal in response to an encoded bit stream.

14. The method according to claim 10, further comprising the step of:
  comparing said second portion of said input signal with one or more code words stored in a memory.

15. The method according to claim 14, further comprising the step of:
  programming said memory with one or more code tables of one or more data compression standards.

16. The method according to claim 10, further comprising the step of:
  starting said second portion at a first bit of said input signal when said first control signal has a first state; and
  starting said second portion at a bit of said input signal determined in response to said second control signal when said first control signal has a second state.

17. An apparatus comprising:
  a first circuit configured to generate a first output signal in response to (i) an input signal, (ii) a first control signal and (iii) a second control signal; and
  a logic circuit configured to generate (i) a second output signal, (ii) said first control signal and (iii) said second control signal in response to a predetermined portion of said input signal, wherein (A) said logic circuit comprises one or more hardwired look-up tables configured to generate (i) said second output signal, (ii) said first control signal and (iii) said second control signal in response to said predetermined portion of said input signal and (B) said one or more hardwired look-up tables are configured to decode a plurality of variable length code words having a bit length shorter than said predetermined portion of said input signal.

18. A method for decoding multiple symbols of a variable length code in a single clock cycle comprising the steps of:
  (A) generating a first output signal, a first control signal and a second control signal in response to a predetermined portion of an input signal;
  (B) generating a second output signal in response to said input signal, said first control signal and said second control signal;
  (C) starting said second portion at a first bit of said input signal when said first control signal has a first state; and
  (D) starting said second portion at a bit of said input signal determined in response to said second control signal when said first control signal has a second state.

19. An apparatus comprising:
  a first circuit configured to generate a first output signal in response to (i) an input signal, (ii) a first control signal and (iii) a second control signal;
  a logic circuit configured to generate (i) a second output signal, (ii) said first control signal and (iii) said second control signal in response to a predetermined portion of said input signal; and
  an input circuit comprising a barrel shifter configured to generate said input signal in response to an encoded bit stream.

* * * * *